United States Patent
Potter, Jr. et al.

(10) Patent No.: US 6,368,775 B1
(45) Date of Patent: Apr. 9, 2002

(54) 3-D PHOTO-PATTERNING OF REFRACTIVE INDEX STRUCTURES IN PHOTOSENSITIVE THIN FILM MATERIALS

(75) Inventors: Barrett George Potter, Jr.; Kelly Simmons Potter, both of Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/492,956

(22) Filed: Jan. 27, 2000

(51) Int. Cl.⁷ ............................. G02B 6/10; G02B 6/16
(52) U.S. Cl. .................. 430/322; 430/321; 430/326; 430/290; 385/130; 385/131; 385/132
(58) Field of Search ................... 430/5, 321, 322, 430/326, 290; 385/10, 129, 130, 131, 132

(56) References Cited

U.S. PATENT DOCUMENTS

| | | | |
|---|---|---|---|
| 5,402,514 A | * 3/1995 | Booth et al. | 385/130 |
| 5,541,039 A | * 7/1996 | McFarland et al. | 430/290 |
| 5,714,284 A | 2/1998 | Hirsh et al. | |
| 5,798,292 A | 8/1998 | Jost et al. | |
| 5,841,928 A | 11/1998 | Maxwell et al. | |
| 5,854,868 A | * 12/1998 | Yoshimura et al. | 385/50 |
| 5,881,186 A | * 3/1999 | Starodubov | 385/37 |
| 5,882,400 A | 3/1999 | Bauer et al. | |
| 5,896,484 A | * 4/1999 | Borrelli et al. | 385/132 |
| 5,932,397 A | * 8/1999 | Mustacich | 430/321 |
| 5,940,568 A | 8/1999 | Losch | |
| 6,221,566 B1 | * 4/2001 | Kohnke et al. | 430/321 |
| 6,222,973 B1 | * 4/2001 | Starodubov | 385/128 |

OTHER PUBLICATIONS

Oppliger et al., "One–step 3D Shaping Using a Gray–Tone Mask for Optical and Microelectronic Applications" Microelectronic Engineering, 23 (1994), 449–454.*

* cited by examiner

Primary Examiner—Janet Baxter
Assistant Examiner—Amanda C. Walke
(74) Attorney, Agent, or Firm—Elmer A. Klavetter

(57) ABSTRACT

A method of making a three-dimensional refractive index structure in a photosensitive material using photo-patterning. The wavelengths at which a photosensitive material exhibits a change in refractive index upon exposure to optical radiation is first determined and then a portion of the surface of the photosensitive material is optically irradiated at a wavelength at which the photosensitive material exhibits a change in refractive index using a designed illumination system to produce a three-dimensional refractive index structure. The illumination system can be a micro-lenslet array, a macroscopic refractive lens array, or a binary optic phase mask. The method is a single-step, direct-write procedure to produce a designed refractive index structure.

20 Claims, 4 Drawing Sheets

3-D PHOTO-PATTERNING OF REFRACTIVE INDEX STRUCTURES IN PHOTOSENSITIVE THIN FILM MATERIALS

This invention was made with Government support under Contract No. DE-AC04-94AL85000 awarded by the Department of Energy. The Government has certain rights in the invention.

BACKGROUND OF THE INVENTION

The invention describes a method for optical irradiation to develop a refractive index pattern and more particularly, a method using photo-patterning technology to develop refractive index structures in photosensitive thin film materials.

Photo-lithographic patterning typically focuses on the formation of two-dimensional patterns in a material, involving the use of multiple chemical and mechanical processing steps and material deposition steps. A positive or negative image of the desired configuration is first introduced into a material by exposing it to patterned radiation that induces a chemical change in the exposed portions of the resist. This chemical change is then exploited to develop a pattern in the material, which is then transferred into the substrate underlying the resist. Photo-patterning is used to alter the chemical resistance of photoresist material that is not retained in the finished product. The photo-patterned photoresist provides an opportunity to selectively deposit materials at precise locations over the surface of the piece or to selectively etch certain locations. Thus, refractive index structures are usually formed using dissimilar material types (such as glass versus crystalline or insulator versus semiconductor) or material compositions (varied dopant identities or concentrations) whose spatial distribution is formed via the photo-patterning of photoresist layers. Because of this use of multiple materials, multiple photo-patterning steps and chemical processing of the piece are generally required. These steps also require precise registry of the mask images used in consecutive photo-patterning steps.

Other methods for the formation of refractive index structures include electron and ion beam etching (including reactive ion etching). In these cases, spatial patterning of the refractive index is dictated by selective exposure (etching) of the parent material with a particle beam. This is followed by further thermal or chemical processing and/or deposition of dissimilar materials to provide a finished product. These energetic particle approaches require vacuum chamber technology and can be expensive. With control of the etching conditions, it is possible to build in some control of the structure cross section with depth into the material but the types of structure possible are limited and, again, the overall process in multi-step in nature, yielding a heterogeneous material structure.

Mechanical machining might also be used but the difficulties in the formation of complex shapes at a small scale tend to make this approach expensive and not amenable to large volume production.

Useful would be a method for producing changes in the refractive index values of specified volumes of a photosensitive material using a single, direct-write optical method to produce a three-dimensional refractive index structure.

SUMMARY OF THE INVENTION

According to the present invention, a method of making a refractive index structure in a photosensitive material using photo-patterning is provided. The wavelengths at which a photosensitive material exhibits a change in refractive index upon exposure to optical radiation is first determined and then a portion of the surface of the photosensitive material is optically irradiated at a wavelength at which the photosensitive material exhibits a change in refractive index using a designed illumination system to produce a three-dimensional refractive index structure. The photosensitive material is selected from compounds that can encompass inorganic, organic, and hybrid (inorganic-organic composite) materials, including oxide and non-oxide glasses such as germanosilicates, polygermanes, polysilanes, polygermane and polysilane sol-gel hybrids, and photoactive polymers such as functionalized polyesters. The illumination system can be a micro-lenslet array, a macroscopic refractive lens array, and a binary optic phase mask.

In one embodiment, a laser, such as an excimer laser, is used to optically irradiate the surface. A light coherence length less than the photosensitive material thickness is generally utilized. In general, the wavelength of the optical radiation is chosen to match an absorption band of the photosensitive material.

In another embodiment, the photosensitive material is first deposited on a substrate providing high transmission or high absorption at the wavelength used during photo-exposure, such as fused silica glass.

In another embodiment, a film is first deposited on the surface of a photosensitive material to produce a stack, with the said film selected from a reflective material and a photoresist material. This film stack is then illuminated using a designed illumination system to produce a three-dimensional refractive index structure. The optically irradiated volume can undergo either a positive or negative refractive index change.

In another embodiment, the three-dimensional refractive index structure has triangular-cross-section, low refractive index regions that traverse the thickness of the photosensitive material.

DESCRIPTION OF SPECIFIC EMBODIMENTS

The method of the present invention forms refractive index structures within at least one optically homogeneous, photosensitive material in a single-step, direct-write, optical procedure that results in the final product directly. A photosensitive material is a material that undergoes a change in some property upon exposure to optical radiation. In the method of the present invention, the property of interest is the refractive index of the material. A refractive index structure in a material is an organization of volumes within the material that have regions of like and dissimilar refractive index values resulting from the pattern designed by the optical procedure.

The photo-patterning process utilized is not an intermediate step in the formation of a refractive index pattern in the final product as in conventional photolithography. Moreover, the nature of the photosensitive response in the materials used, coupled with the optical patterning approach, allows the cross-section of refractive index structures to be controlled with depth into the material being processed. The depth of these structures into the material will depend on the material and optical conditions but can be much greater that the typical single step processing depth used in photolithography. Thus, in a single step, the method of the present invention provides a finished refractive index structure that can be tailored in all three dimensions. In addition, the method does not involve the need for mask alignment as with previously photo-imprinted structures.

Figure 1:
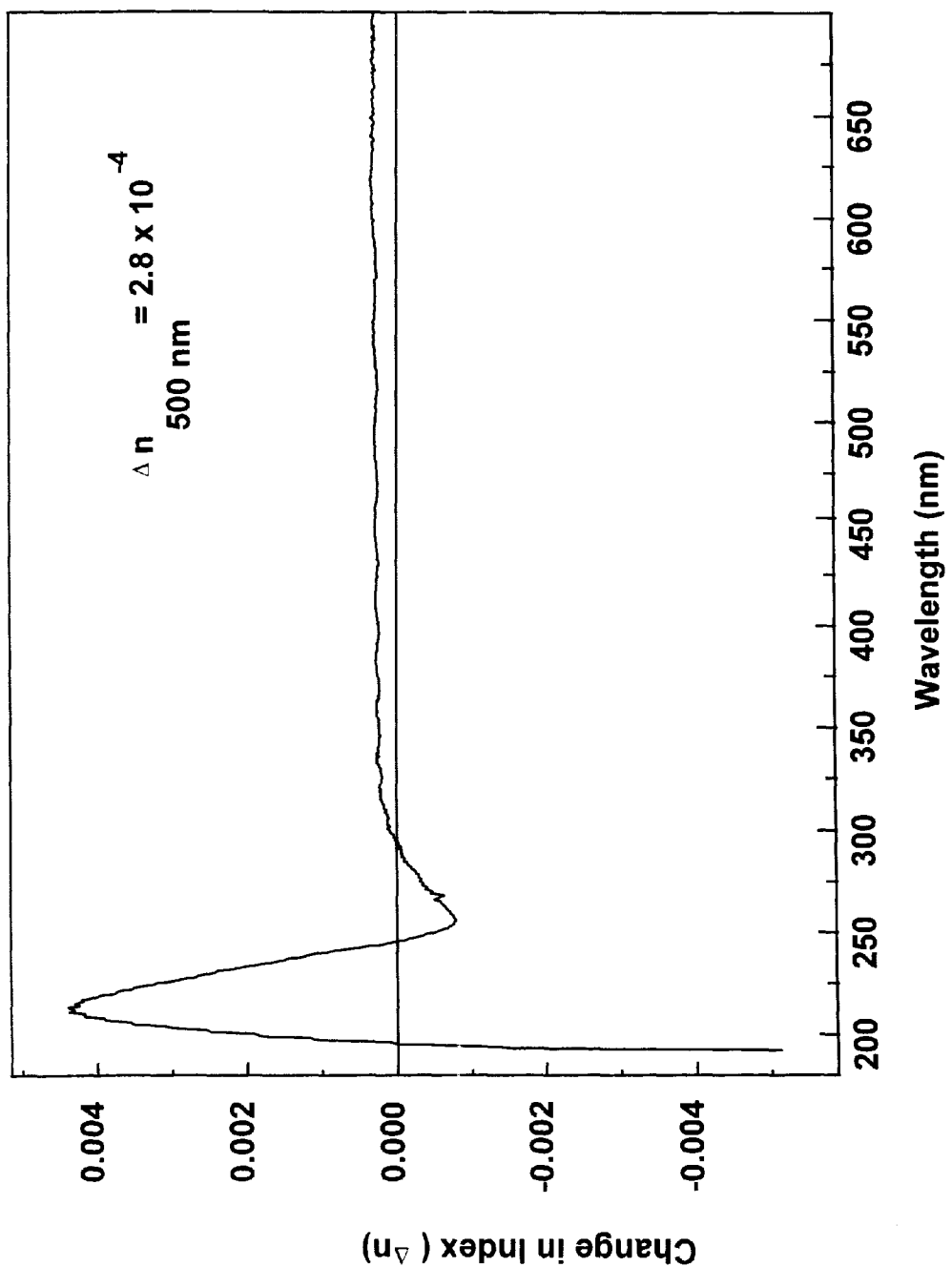
FIG. 1 shows the change in refractive index of a gemanosilicate glass at varying wavelengths.

In one embodiment, a photosensitive material is first characterized to determine the wavelengths at which the material changes refractive index upon exposure to an optical source and to determined the magnitude of this change. When optically irradiated at a particular wavelength, the material undergoes either a positive refractive index change or a negative refractive index change. As shown in FIG. 1, a material, such as the 50/50 $GeO_x/SiO_y$ (x<2, y<2) germanosilicate photosensitive glass for which results are shown in the figure, can undergo a positive refractive index change at one wavelength and a negative refractive index change at another wavelength. It has been demonstrated that 0.005 photo-induced change in the refractive index of inorganic germanosilicate photosensitive glass can be achieved at a wavelength of approximately 500 nm. Other photosensitive materials that can be used including oxide and non-oxide glasses such as germanosilicates, polygermanes, polysilanes, polygermane and polysilane sol-gel hybrids, and photo-active polymers such as functionalized polyesters. In the context of the method of the present invention, a photosensitive material is any material that exhibits a photochemical reaction that results in a change in its refractive index. This includes, but is not limited to, materials that exhibit photo-induced phenomena such as bond rearrangement/reformation, volume changes, changes in strain state, cross-linking, changes in conjugation length, and substitution on aryl-ring structures. The photosensitive material can be fabricated as either a free-standing film or plate or on a substrate. The substrate material can be a fused silica glass, for example. A portion of the surface of the photosensitive material is irradiated by an optical source using an appropriately designed illumination system. This illumination system can be, for example, a micro-lenslet array, a binary optic phase mask or a macroscopic refractive lens array. The optical radiation impinges on one surface of the photosensitive material. The illumination system provides the correct wavelength to match the photosensitive response wavelength needed by the photosensitive material. The wavelength is chosen to match an absorption band of the photosensitive material. It is through absorption into this band that the light energy couples to the material to produce the index change. The volume of the photosensitive material that is irradiated by the illumination system thereby undergoes either a positive or negative refractive index change, resulting in a three-dimensional refractive index structure.

The optical source used to irradiate the stack can be a laser, such as an excimer laser or other high-power optical source. In one embodiment, the photosensitive material is exposed to a source using ultraviolet light. Using photosensitive materials that are sensitive to ultraviolet light avoids the presence of optical absorption in the visible portion of the spectrum. In a single step irradiation procedure, the refractive index of the photosensitive material is changed at those three-dimensional locations that are irradiated by the illumination system. The illumination system can be designed to irradiate the photosensitive material in any arbitrary geometry to produce a desired threedimensional pattern of change of refractive index. In general, the illumination system and optical source are selected to produce a light coherence length less than the photosensitive material thickness.

Figure 2:
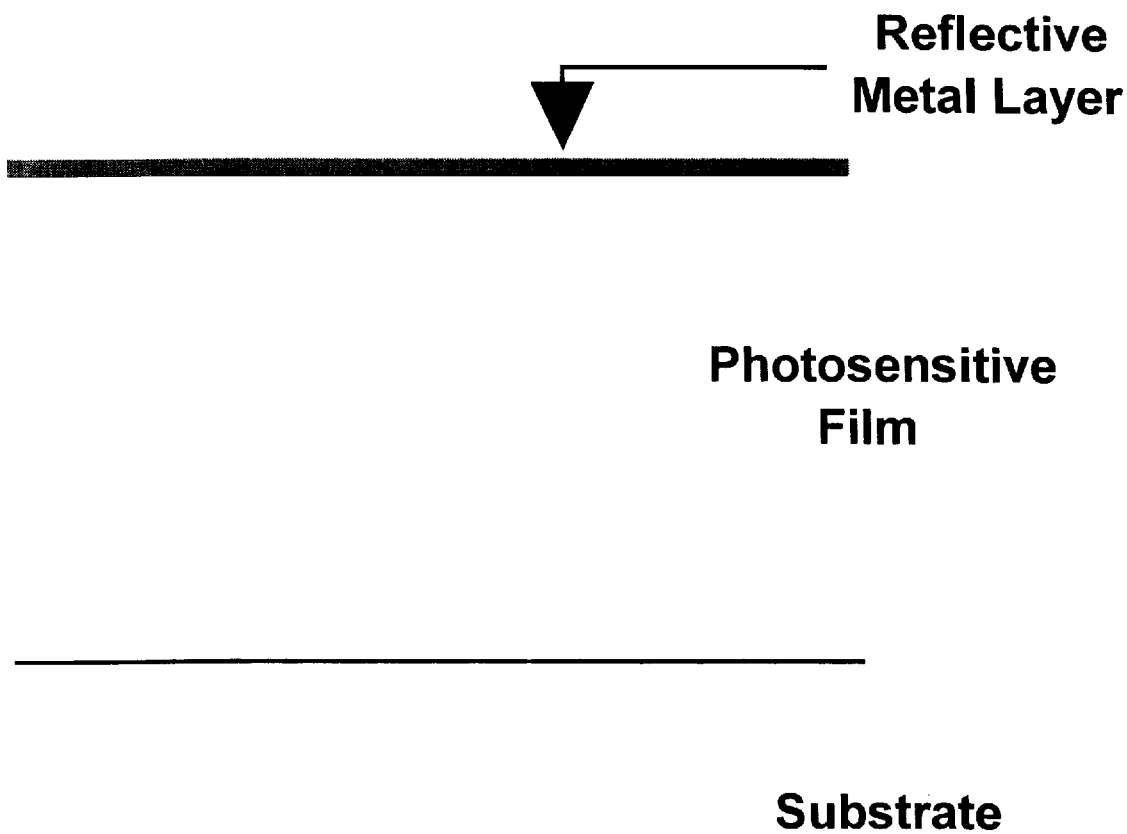
FIG. 2 shows an illustration of a photosensitive material on a substrate with a reflective material.
Figure 3:
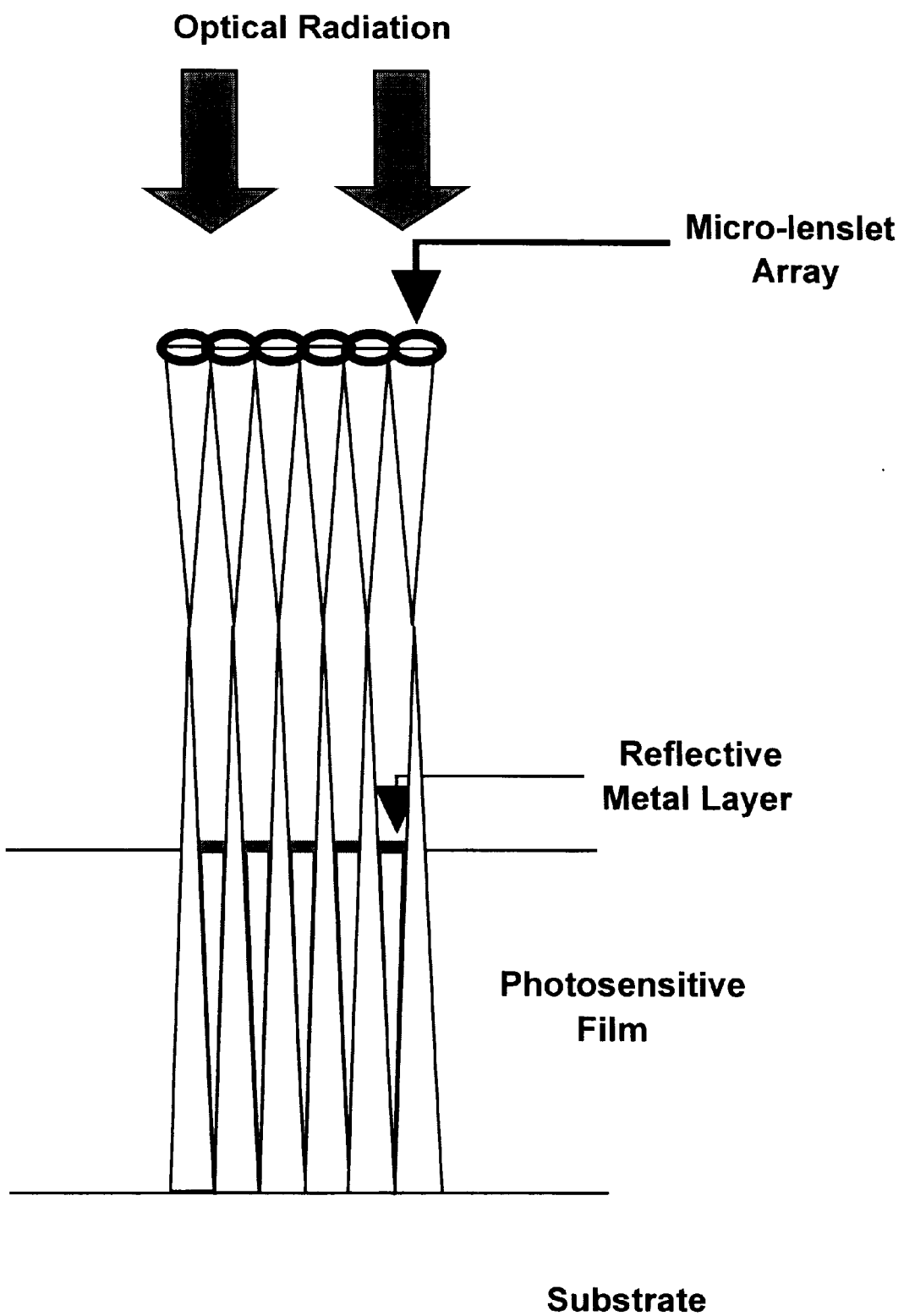
FIG. 3 shows an illustration of a micro-lenslet array designed to provide triangular regions of refractive index change.
Figure 4:
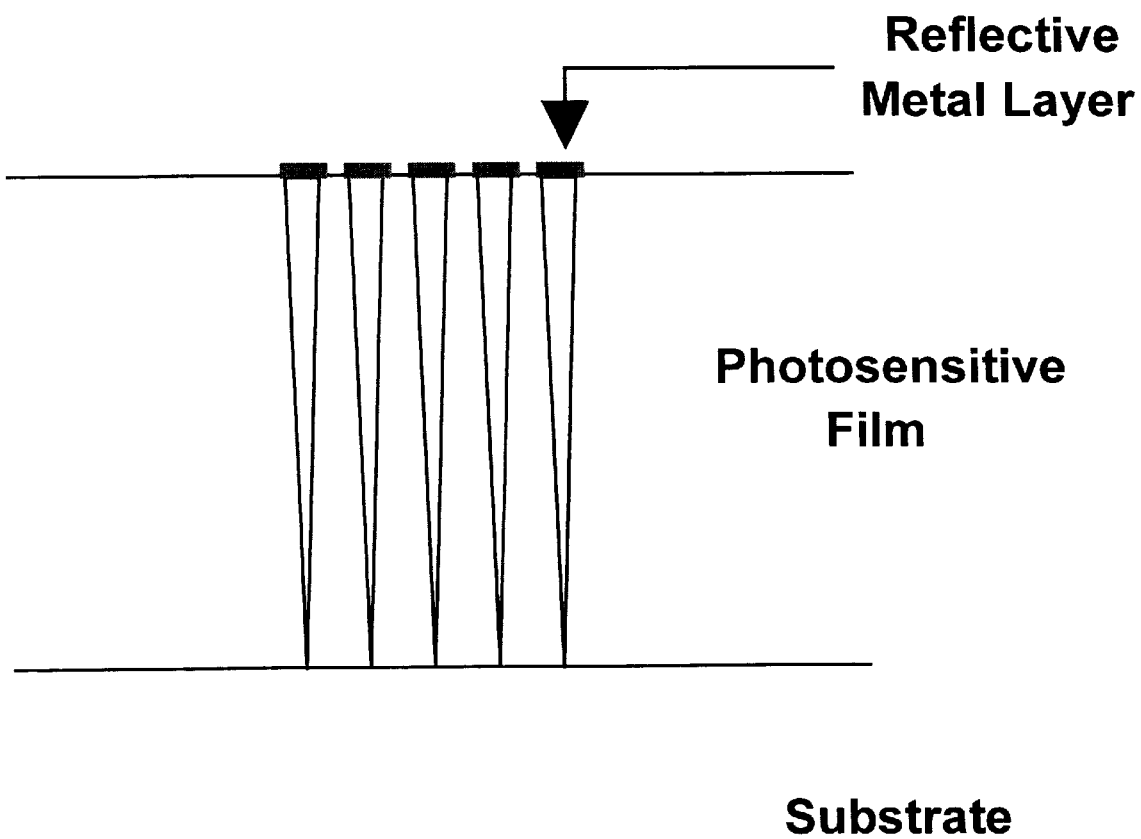
FIG. 4 shows an illustration of a photosensitive material with a threedimensional refractive index structure.

In one embodiment, a reflective film is deposited on the top surface of the photosensitive material. The reflective film is generally a metallic film, such as an aluminum, chromium, platinum, gold, or nickel film, capable of photo-ablation by the optical source used to irradiate (that is, write) the refractive index structure. A multilayer dielectric film, such as a $TiO_2/SiO_2$, can also be used. FIG. 2 shows an illustration of a photosensitive material on a substrate with a reflective material deposited thereon, referred to as a stack. When the stack is irradiated, the reflective film is ablated in those areas determined by the illumination system and the photosensitive material undergoes a change in its fundamental optical response (that is, the refractive index) in the irradiated areas. For example, the micro-lenslet array illustrated in FIG. 3 is designed to provide triangular regions of lower refractive index surrounded by triangular regions of higher refractive index. The micro-lenslet array is designed to focus light such that the entire metal-photosensitive film-substrate layer stack is exposed, except in the triangular regions required to have a lower refractive index. Pulsed or continuous wave (or combination) radiation is used to insure ablation of the reflective film and saturated refractive index change in the photosensitive material, resulting in a photosensitive material with a three-dimensional refractive index structure with a positive index change, as illustrated in FIG. 4. The only portions of the original metal film that remain following the optical exposure are those located on the bases of the low refractive index triangles. Thus, by simply exposing the stack through an appropriate focusing mask, a three-dimensional refractive index structure is fabricated in a single step, avoiding multiple mask alignments and chemical processing.

In another embodiment, the registry of the reflective layer structure and the underlying refractive index structure is insured during the optical processing step using photosensitive materials that produce a decrease (or negative change) in the base refractive index of the material. First, a photoresist (whose characteristic is to become less chemically durable upon optical radiation exposure) is deposited on top of the photosensitive film. The photoresist can be any commercially available organic photoresist that can be easily etched away when needed. The photoresist/photosensitive film stack is exposed with the desired illumination system, as previously described. Optical radiation impinges on the stack through the transparent substrate (or from the side opposite the photoresist in a free-standing film or plate) first. In this case, the optical source wavelength allows the saturated response of the photosensitive material index change and the complete activation of the photoresist. Because the photoresist is less durable in the areas that have been exposed to the optical source, the altered photoresist can be removed by chemically etching using an appropriate solvent, leaving photoresist in areas not exposed to the optical source. A reflective layer is then deposited on the surface. Another solvent is used to remove the unneeded reflective layer in conjunction with the photoresist, leaving behind reflective material precisely aligned with the 3-D patterning photosensitive material beneath.

One aspect of the present invention is that the method of the present invention can be scaled to larger sizes. In general, the writing process is not dependent on diffractive effects in either the mask arrangement or the structure formed. Macroscopic structures (even to millimeter sizes and larger) may be photo-imprinted. While photo-lithographic techniques could conceivably be applied to form very large index structures, the chemical steps needed, requiring large volumes of solvents and etchants, for example, would most likely make the use of these techniques too expensive and impractical. Moreover, increases in scale would mean a greatly increased number of process steps to accurately control the cross-section of the larger refractive index structure with depth. The present method thus avoids these material processing limitations by allowing the photo-patterning of a finished, three-dimensional (3-D) refractive index structure within a given photosensitive material in a single step.

Another aspect of the method of the present invention is that it can involve the simultaneous optical patterning of two or more dissimilar, photosensitive, material layers such that there is precise registry of the structures in both layers without the need for mask alignment (registry).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method of making a refractive index structure in a photosensitive material using photo-patterning, comprising:

determining a wavelength at which a photosensitive material exhibits a change in refractive index upon exposure to optical radiation, said photosensitive material having a thickness m; and optically irradiating a portion of the surface of the photosensitive material with a light coherence length less than the photosensitive material thickness m at the wavelength at which the photosensitive material exhibits a change in refractive index, using a designed illumination system to produce a three-dimensional refractive index structure.

2. The method of claim 1 wherein the photosensitive material is selected from the group consisting of oxide and non-oxide glasses, polygermanes, polysilanes, polygermane and polysilane sol-gel hybrids, and photo-active polymers.

3. The method of claim 1 wherein the photosensitive material is a germanosilicate.

4. The method of claim 1 wherein the designed illumination system is selected from a group consisting of a micro-lenslet array, a macroscopic refractive lens array, and a binary optic phase mask.

5. The method of claim 1 wherein the step of optically irradiating said surface is performed using a laser.

6. The method of claim 5 wherein the laser in an excimer laser.

7. The method of claim 1 wherein the wavelength is chosen to match an absorption band of the photosensitive material.

8. The method of claim 1 wherein the photosensitive material is first deposited on a substrate.

9. The method of claim 8 wherein the substrate is fused silica glass.

10. A method of making a refractive index structure in a photosensitive material using photo-patterning, comprising:

depositing a film on the surface of a photosensitive material, said photosensitive material having a thickness m, to produce a stack, said film selected from a group consisting of a reflective material and a photoresist material; and optically irradiating a portion of the volume of said photosensitive material with a light coherence length less than the photosensitive material thickness m using a designed illumination system to produce a three-dimensional refractive index structure.

11. The method of claim 10 wherein the step of optically irradiating a portion of the volume of said photosensitive material produces an increase in the refractive index of the portion of the volume of said photosensitive material.

12. The method of claim 10 wherein the photosensitive material is deposited on a substrate.

13. The method of claim 10 wherein the film is selected from the group consisting of aluminum, chromium, platinum, gold, nickel and $TiO_2/SiO_2$.

14. The method of claim 10 wherein the step of optically irradiating said surface of said photosensitive material is performed using a laser.

15. The method of claim 10 wherein the design illumination system is selected from the group consisting of a micro-lenslet array, a macroscopic refractive lens array, and a binary optic phase mask.

16. The method of claim 10 wherein the three-dimensional refractive index structure has triangular-cross-section, low refractive index regions that traverse the thickness of the photosensitive material.

17. The method of claim 10 wherein said film is a photoresist, said photoresist changing chemical solubility when irradiated.

18. The method of claim 17 wherein the step of optically irradiating a portion of the volume of said photosensitive material produces a decrease in the refractive index of the portion of the volume of said photosensitive material.

19. The method of claim 18 further comprising the step of removing said photoresist after optically irradiating said stack.

20. The method of claim 19 wherein the step of removing said photoresist is performed by removing said photoresist with an etchant material.

* * * * *